United States Patent Office 3,567,451

Patented Mar. 2, 1971

3,567,451

PHOTOSENSITIVE COMPOSITIONS AND ELEMENTS USING DIELS-ALDER ADDUCTS OF QUINOLIZINIUM SALT DERIVATIVES

Douglas G. Borden, Donald L. Fields, and Jerry B. Miller, Rochester, N.Y., assignors to Eastman Kodak Company, Rochester, N.Y.

No Drawing. Filed June 14, 1967, Ser. No. 645,880
Int. Cl. G03c *1/94*
U.S. Cl. 96—86 17 Claims

ABSTRACT OF THE DISCLOSURE

Photosensitive compositions and elements comprising Diels-Alder adducts having generic formula:

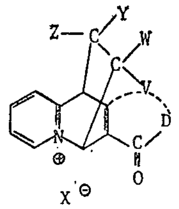

where $X^{\ominus}$ is an anion; D represents the atoms necessary to form a 5 or 6 membered ring, said atoms in D containing an

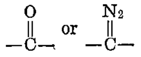

group, each of V, W, Y and Z separately being hydrogen, alkyl, aryl, cyano, alkylthio, alkoxy, dialkylamino or aralkyl, provided no more than one of V, W, Y and Z is cyano; Y and Z when taken together being alkylenedioxy or V, W, Y and Z when taken together being the atoms or chemical bonds necessary to form a 5 or 6 membered fused ring.

This invention relates to photomechanical reproduction methods and materials and more particularly to light sensitive layers the solubilities of which are differentially modified by imagewise exposures to light.

It is known in the graphic arts to prepare printing plates and stencils by processes which involve as essential features the imagewise exposure of a coating of a light sensitive material, the solubility of which is differentially modified by the action of light, and subsequent treatment of the coating with a solvent or solvent system which preferentially removes portions of the coating in accordance with their exposure to light. Processes in which the exposed materials are preferentially removed to afford a duplicate of the pattern through which they were exposed are termed positive working and processes in which the unexposed materials are preferentially removed are termed negative working. Many such processes are known in the art, notable among which are those which employ as light sensitive materials bichromated colloids, light sensitive resins, azide sensitized resins and diazo compounds.

We have discovered certain new light sensitive materials and the process of making these materials.

It is an object of this invention to provide new light sensitive materials the solubilities of which are differentially modified by the action of light which are useful as photoresists and as coatings for lithographic printing plates. It is another object of this invention to provide photographic layers comprising said new light sensitive materials. It is still another object of this invention to provide photographic elements comprising a support and a layer comprising at least one of said new light sensitive materials. A still further object is to provide a method of making new Diels-Alder adducts.

These and other objects are accomplished by the preparation and use of novel Diels-Alder adducts obtained from the reaction of certain quinolizinium salts with nucleophilic olefins as described hereinbelow.

The Diels-Alder reaction is well known and consists of the 1,4-addition to a conjugated diene of an ethylenically unsaturated compound in which the ethylenic linkage usually is, but need not be, a part of a conjugated system. Such ethylenically unsaturated compounds are known as dienophiles and the cyclic products obtained are spoken of as adducts. A mechanism which has been proposed for the reaction postulates that the electron-rich diene supplies a pair of electrons to the relatively electron-poor double bond of the dienophile to form a complex that is held together by ionic forces, said complex then rearranging to yield the stabilized adduct (cf. Organic Reactions, Volume IV, page 8 et seq.). This mechanism appears to be supported by certain characteristics of the Diels-Alder reaction observed in the practice of the art.

Surprisingly, in contrast to the technique of the prior art, we have found that electron-poor dienes comprising ortho-fused derivatives of quinolizinium salts having fused to the 2- and 3- positions of the quinolizinium ring system (I),

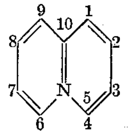

(I)

a ring containing one carbonyl group and either a diazo group or another carbonyl group, and which may be fused to other cyclic ring systems, will react readily with nucleophilic dienophiles, in a Diels-Alder reaction having an inverse electron demand, to afford novel, light sensitive, Diels-Alder adducts, the dienophile adding across the 1- and 4-position of the quinolizinium ring system.

The electron-rich (nucleophilic) dienophiles correspond to Formula II,

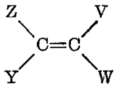

(II)

wherein each of V, W, Y and Z are selected from the class consisting of hydrogen, alkyl, e.g. 1 to 8 carbon atoms, aryl, e.g. phenyl, tolyl, etc., aralkyl, e.g. benzyl, etc., dialkylamino, e.g. alkyl group of 1 to 4 carbon atoms, cycloaliphatic, e.g. cyclopentyl, etc., alkoxy e.g. 1 to 3 carbon atoms, alkylthio, e.g. 1 to 4 carbon atoms, and cyano, provided no more than one of V, W, Y and Z is cyano; Y and Z or V and W when taken together being alkylenedioxy, e.g. -o-alkylene-o- having 1 to 4 carbon atoms, or V, W, Y and Z when taken together being the atoms or chemical bonds necessary to form a 5 or 6 membered ring, e.g. carbocyclic or heterocyclic ring system having 1 to 2 fused rings.

Representative examples of such dienophiles include α-olefins, styrenes, vinyl substituted heterocycles, enamines, vinyl ethers, vinyl thioethers, acrylonitrile, allyl alcohol, 3-dialkylaminopropenes, ketene acetals, ketene aminals, 1,1-dialkylethylenes, 1,1,2,2-tetralkylethylenes, 1,2-dialkoxyethylenes, cyclopentadiene, methycyclopentadiene, cyclohexadiene, cycloheptadiene, cyclopentenes, cyclohexenes, cycloheptenes, dihydrofurans, dihydropyrans and the like.

The quinolizinium salt derivatives which are useful in the practice of our invention correspond to Formula III,

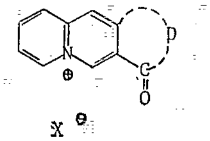

(III)

wherein $X^{\ominus}$ is an anion such as a halide ion, a perchlorate ion, a tetrafluoroborate ion, etc.; D comprises the atoms necessary to form a 5- or 6-membered ring containing a >C=O or $>C=N_2$ group.

The novel Diels-Alder adducts of our invention correspond to the Formula IV,

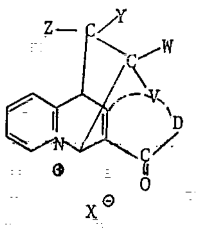

(IV)

wherein $X^{\ominus}$ is an anion; D represents the atoms necessary to form a 5 or 6 membered ring, said atoms in D containing an $$-\overset{\overset{O}{\|}}{C}- \text{ or } -\overset{\overset{N_2}{\|}}{C}-$$

group, each of V, W, Y and Z separately being hydrogen, alkyl, aryl, cyano, alkylthio, alkoxy, dialkylamino or aralkyl, provided no more than one of V, W, Y and Z is cyano; Y and Z when taken together being alkylenedioxy or V, W, Y and Z when taken together being the atoms or chemical bonds necessary to form a 5 or 6 membered fused ring. When D forms a ring, D also includes 1–3 substituted fused rings having substituted groups including one or more oxo, alkyl, aryl, aralkyl, diazo, alkoxy, etc.

These adducts are prepared by dissolving or suspending a quinolizinium salt corresponding to Formula III in an organic solvent and treating the solution or mixture with a nucleophilic dienophile corresponding to Formula II, allowing the resulting mixture to stand at room temperature or at elevated temperatures for a sufficient length of time for reaction to occur, and precipitating the product by addition of a non-solvent for the salt product, such as diethyl ether, petroleum ether, or the like. It will be apparent to those skilled in the art that the length of time required to effect the reaction will vary with the particular diene and dienophile employed and reaction times ranging from a few minutes to a few days may be employed. It will also be apparent that the temperature employed may also vary from about —10° C. to about 150° C., depending upon the reactivity and stability of the diene and dienophile employed and the stability of the product obtained. In general, it is preferred to employ the lowest reaction temperature which will produce a convenient rate of reaction to avoid side reactions, such as polymerization, reversibility of the Diels-Alder reaction, decomposition, etc., which are more prevalent at higher temperatures.

It will be appreciated by those skilled in the art that two structural isomers are possible when an unsymmetrical diene and an unsymmetrical dienophile interact and that when the dienophiles corresponding to Formula II react with dienes corresponding to Formula III, the positions of the groupings,

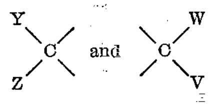

as exemplified in Formula IV, may be interchanged. Unfortunately, the structures of the adducts obtained from particular unsymmetrical dienes and dienophiles cannot be predicted with certainty and mixtures of the two possible structural isomers may also result. Formula IV, therefore, should be interpreted as including compounds in which the positions of the groups

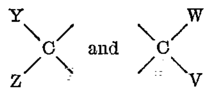

are interchanged and also including mixtures of the two possible structural isomers.

Similarly, in Diels-Alder additions, stereoisomeric adducts are possible, and since the configurations of the products of our invention have not been determined, Formula IV should be interpreted as including all of the possible stereoisomers, particularly since the configuration of the adduct will vary with the configuration of the particular dienophile employed. For example, cis and trans dienophiles will afford stereoisomeric adducts since the Diels-Alder reaction normally exhibits a pronounced stereochemical selectivity (cf. Organic Reactions, Volume IV, pages 10 et seq.).

In one embodiment of our invention, a photoresist composition is prepared employing at least one adduct mixed with a film forming resin. For instance, the film forming resin may be a phenol formaldehyde resin such as those known as novolak or resole resins which form a complex or a reaction product with the adduct. In a particularly useful system, an alkali soluble phenol formaldehyde resin is used which reacts with the adduct to form a reaction product which is insoluble in alkali but which forms decomposition products upon exposure to actinic rays which are soluble in dilute alkali. The term "reaction product" is intended to include a complex or other association product. This mixture results in a photoresist. In a particularly useful embodiment, the ratio of adduct to resin is between 1:1.5 to 1:20 and results in especially good performance at a ratio of 1:5 to 1:10. The amount of alkali and strength needed to process the exposed resist depends upon the ratio of adduct to resin. The alkali solution may range in strength up to that of 5% aqueous sodium hydroxide.

It will be appreciated that the photoresist compositions can be provided in a dry form to be mixed with a suitable solvent. However, a particularly suitable way of providing the photoresist is in a solvent solution using one or more volatile organic solvents which are solvents for both the resinous material and the Diels-Alder adducts. The solution can be used as provided or can be further diluted depending upon the purpose for which it is to be used.

The light sensitive compositions of our invention may be applied to a clean surface by flowing, spraying, dipping, whirling, etc. and air dried. If desired, a prebake of 10 to 15 minutes at 60° C. is given to remove residual solvent and the coating is exposed through a pattern to a light source such as a carbon arc. The resist coating, if positive acting, is then placed in a developer solvent such as an aqueous alkaline developer, to remove the exposed areas. The alkaline strength of the developer, as well as the presence of addenda such as solvents, is governed by the particular adduct used, the anion present, the resin employed and the ratio of adduct to resin. The developer may also contain dyes and hardening agents. The developed image is rinsed with distilled water, dried and postbaked for 15 to 30 minutes at 60 to 80° C. The substrate can then be etched by acid etching solutions such as ferric chloride.

In another embodiment of our invention, a solution containing at least one of the adducts of our invention is coated upon a lithographic support material by one of the conventional techniques such as whirl coating, flow coating, dip coating, hopper coating, etc. and allowed to dry. The resulting photographic element is then exposed to actinic radiation such as that from an ultraviolet light source and subsequently developed with a solvent for the unexposed portions of the light sensitive coating to obtain an image suitable for use in lithographic printing.

Suitable support materials include screens of the type used in the preparation of stencils, such as silk screens and the like, and rigid and flexible materials such as zinc, copper, anodized aluminum, grained aluminum, copper and specially prepared metal and paper supports, metal foils, superficially hydrolyzed cellulose ester films, polymeric films such as polyolefins, polyesters, polyamides, etc. These materials are well known in the art and need not be specifically enumerated.

The layers are advantageously coated from organic solvents which may be selected from those which are capable of dissolving the light sensitive materials, without reacting with them and which are substantially incapable of attacking the support material. It will be appreciated by those skilled in the art that the choice of solvents is empirical, being dependent upon the materials to be dissolved and the support materials employed. Preferably, solvents capable of dissolving at least 0.2 percent by weight of the light sensitive materials are employed.

Exemplary solvents are dimethylformamide, 2-ethoxyethanol, cyclohexanone, acetonitrile, nitromethane, butyrolactone, and mixtures of these solvents with each other and with other solvents such as the lower ketones and alcohols.

The concentrations of the light sensitive materials in the coating solutions are dependent upon the nature of the light sensitive materials employed, the support, and the coating method. In general, good coatings are obtained when the coating solutions contain 0.05–5 parts by weight and preferably from 0.5–2 parts by weight of light sensitive material. Higher concentrations than 5 weight percent may also give satisfactory results.

It will be appreciated by those skilled in the art that it may be advantageous to include in the coating solution materials which may serve to improve film formation, coating properties, adhesion of the coatings to the support materials, mechanical strength, etc. Exemplary materials include resins, stabilizers, and surface active agents. When resins are employed, they are usually selected from those that are soluble in both the coating and developing solvents although minor portions of resins which are insoluble in the developing solvents may also be included. The amounts of such resins, soluble in both the coating and developing solvents, employed in the preparation of the light sensitive coatings will vary with the particular resins and light sensitive material employed and with the intended use of the coatings. For example, coatings intended for use in the preparation of planographic printing plates usually contain from 0.1–1 part by weight of resin per part of light sensitive material, and preferably from 0.3–1 part, while coatings to be employed for resist purposes may contain from 1–50 parts by weight of resin per part of light sensitive material, and preferably from 3–10 parts.

The photographic elements of our invention are exposed by conventional methods to a source of actinic radiation, such as an ultraviolet light source and then developed by flushing, soaking, swabbing, or otherwise treating the light sensitive layers with a solvent or solvent system which exhibits differential solvent action on the exposed and unexposed materials. The developing solvents may be organic or aqueous in nature and may comprise aqueous solutions of inorganic compounds exhibiting an alkaline reaction such as aqueous solutions of alkali metal hydroxides, carbonates, phosphates, and the like. Exemplary solvents include water, aqueous acids, lower alcohols and ketones and aqueous solutions of the lower alcohols and ketones. The resulting images may then be treated in any known manner consistent with their intended use such as treatment with desensitizing etches, plate lacquers, etc.

As pointed out, phenol formaldehyde resins are particularly useful for incorporation in light sensitive coatings containing the adducts defined herein. These phenol formaldehyde resins include those which have been recognized as novolak resins.

The novolak resins are prepared by the condensation of phenols and aldehydes under acidic conditions. Less than 6 moles of formaldehyde are used per 7 moles of phenol to provide products which are permanently fusible and soluble. In a typical synthesis, novolaks are prepared by heating 1 mole of phenol with 0.5 mole of formaldehyde under acidic conditions. The temperatures at which the reaction is conducted are generally from about 25° C. to about 175° C.

The novolak resins are prepared by the condensation of phenol with formaldehyde, more generally by the reaction of a phenolic compound having two or three reactive aromatic ring hydrogen positions with an aldehyde or aldehyde-liberating compound capable of undergoing phenol-aldehyde condensation. Illustrative of particularly useful phenolic compounds are cresol, xylenol, ethylphenol, butylphenol, isopropylmethoxyphenol, chlorophenol, resorcinol, hydroquinone, naphthol, 2,2-bis(p-hydroxyphenyl) propane and the like.

Illustrative of especially efficacious aldehydes are formaldehyde, acetaldehyde, acrolein, crotonaldehyde, furfural and the like. Illustrative of aldehyde-liberative compounds are 1,3,5-trioxane, etc. Ketones such as acetone are also capable of condensing with the phenolic compounds.

The most suitable novolak resins are those which are insoluble in water and trichloroethylene but readily soluble in conventional organic solvents such as methyl ethyl ketone, acetone, methanol, ethanol, etc. Novolak resins having a particularly desirable combination of properties are those which have an average molecular weight in the range between about 350 and 40,000.

It is to be understood that the term novolak resins as used herein, indicates those resins which can be incorporated with the light sensitive polymers; those novolak resins which can be used are those which are either heat fusible or solvent soluble, which permit admixture and association.

The following examples are intended to illustrate our invention but to limit it any way:

EXAMPLE 1

That the carbonyl group or groups are a requisite for the Diels-Alder reaction of nucleophilic dienophiles with quinolizinium salt derivatives is exemplified by the fact that compounds V and VI are recovered unchanged

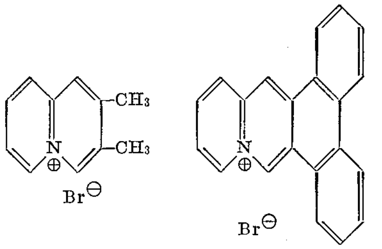

(V) (VI)

when treated for 48 hours with an excess of cycloheptadiene at room temperature or with styrene at 80° C., while compound VII gives good yields of the cyclopentadiene adduct VII in less than one-half hour at room temperature and the styrene adduct IX in 18 hours at 80° C.

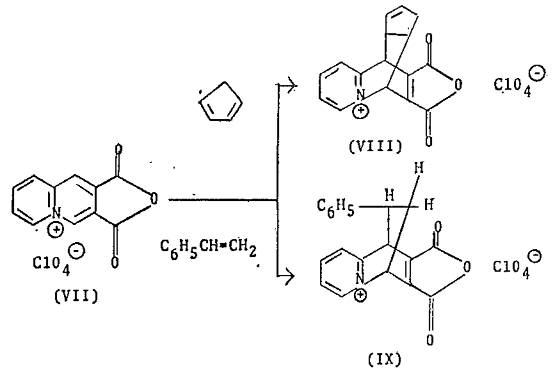

Similarly, the importance of the bridgehead quaternary nitrogen atom of the quinolizinium ring system is emphasized by the fact that compound X is recovered unchanged after treatment at room temperature for 24 hours with cyclopentadiene and with 1,1-diethoxyethylene, while compound XI affords the adducts XII and XIII after treatment with the same reagents for one-half hour at room temperature.

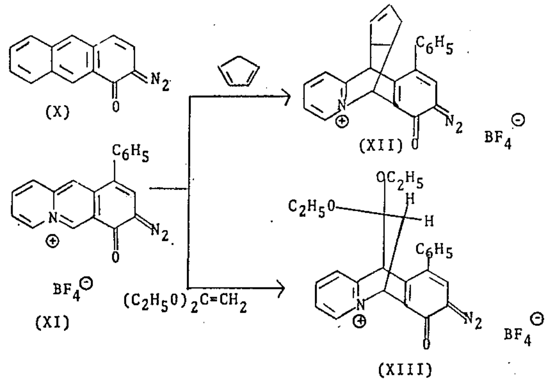

That these Diels-Alder reactions occur is unexpected since the carbonyl function is an electron-withdrawing group and should therefore render the 1,4-diene system of the quinolizinium ring even more electron poor. Apparently the converse of the accepted mechanism for the Diels-Alder reaction cited above prevails, the nucleophilic dienophile (electron rich) supplying a pair of electrons to the relatively electron-poor diene to form the initial complex which then rearranges to form the stable adduct. This premise is given support by the fact that the reactivity of the dienophiles with the relatively electron-poor dienes corresponnding to Formula III increases as the nucleophilic nature (electron richness) of the dienophile increases. This is exemplified by the following order of reactivity of typical dienophiles with a quinolizinium salt derivative of the type employed in our invention:

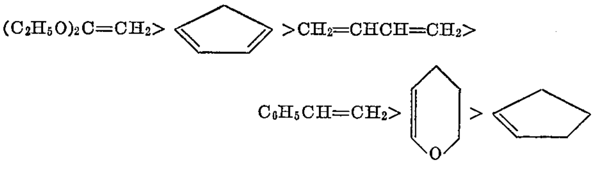

EXAMPLE 2

Preparation of VIII 2,3-dicarboxyquinolizinium hydroxide, inner salt, prepared by the method of Bradsher, et al., J. Org. Chem., 29, 452 (1962), is treated with 72% perchloric acid to obtain 2,3-dicarboxyquinolizinium perchlorate which is converted to the corresponding anhydride VII by treatment with acetic anhydride.

Cyclopentadiene (2.0 g.) is added to a solution of 2.0 g. of VII in a mixture of 100 ml. of nitromethane and 100 ml. of acetonitrile and the resulting solution is allowed to stand at room temperature for 30 minutes, after which 200 ml. of diethyl ether and 500 ml. of ligroin (B.P. 30–60° C.) are added to precipitate 1.34 g. of white crystals of VIII, M.P. 240° C. (dec.).

*Analysis.*—Calcd. for $C_{16}H_{12}ClNO$ (percent): C, 52.5; H, 3.3; Cl, 9.7; N, 3.8. Found (percent): C, 52.9; H, 3.3; Cl, 9.5; N, 3.8.

EXAMPLE 3

Preparation of IX

A mixture of 2 g. of VII and 2 g. of styrene in 100 ml. of nitromethane is heated for 18 hours on a stream bath. The reaction mixture is then diluted with diethyl ether to precipitate 1.1 g. of IX as white crystals.

EXAMPLE 4

Preparation of XII

A total of 100 g. of 5,6-dihydroxy-8-phenyl-4a-azonia-anthracene bromide prepared by the method of Fields et al., J. Org. Chem., 30, 252 (1965), is added in portions over a 15 minute period to a stirred mixture of 200 g. of ice and 200 ml. of concentrated nitric acid. Ethanol (300 ml.) is then added and stirring is continued for about 10 minutes. The precipitate is then collected to obtain a substantially quantitative yield of 8-phenyl-4a-azoniaanthracene-5,6-dione nitrate.

A mixture of 8-phenyl-4a-azoniaanthracene-5,6-dione nitrate (34.8 g.) and p-toluenesulfonylhydrazide (25 g.) is dissolved in 100 ml. of methanol which had been saturated with hydrogen chloride. After standing at autogenous temperature for 15 minutes, the red solution is diluted with 200 ml. of water and 50 ml. of 50% fluoroboric acid. 6-diazo-5-oxo-8-phenyl-4a-azoniaanthracene tetrafluoroborate (XI) separates immediately as a yellow crystalline product which is collected after refrigeration of the mixture for 2 hours at −20° C. Yield: 26.1 g. (68%).

A mixture of 21.2 g. (0.06 mole) of XI and 20 g. of cyclopentadiene in 400 ml. of 1:1 nitromethane-acetonitrile is allowed to stand at room temperature for 30 minutes and then diluted with diethyl ether to precipitate XII as yellow plates.

*Analysis.*—Calcd. for $C_{24}H_{18}BF_4N_3O \cdot H_2O$ (percent): C, 61.4; H, 4.4; B, 2.3. Found (percent): C, 61.2; H, 4.6; B, 2.3.

EXAMPLE 5

Preparation of XIII

A suspension of 5 g. of XI in 50 ml. of acetonitrile is treated with 3.0 g. of 1,1-diethoxyethylene in one portion to obtain an immediate solution. The solution is allowed to stand at room temperature for 5 minutes and then diluted with diethyl ether to obtain 6.37 g. of XIII as yellow needles.

EXAMPLE 6

Preparation of IV, wherein $$D = -\overset{C_6H_5}{\overset{|}{C}}=CH-\overset{N_2}{\overset{\|}{C}}$$

$Z=C_6H_5$—, and $Y=W=V=H$, and $X^\ominus=BF_4^\ominus$.

A mixture of 3 g. of XI and 20 g. of styrene in 100 ml. of nitromethane is allowed to stand at room temperature for 96 hours. The reaction mixture is then diluted with diethyl ether to precipitate 1.8 g. of unreacted XI and 1.3 g. of the adduct IV.

EXAMPLE 7

Preparation of IV, wherein $$D = -\overset{O}{\overset{\|}{C}}-CH=CH-$$

$X^\ominus=ClO_4^\ominus$, $Z=Y=C_2H_5O$, and $W=V=H$.

A total of 50 g. of 5,8-dihydroxy-4a-azoniaanthracene bromide, prepared by the method of Fields et al., J. Org. Chem., 30, 252, (1965), is added in portions over a 15 minute period to a stirred mixture of 100 g. of ice and 100 ml. of concentrated nitric acid. Ethanol (150 ml.) is then added and stirring is continued for about 10 minutes. The precipitate is then collected to obtain a substantially quantitative yield of 4a-azoniaanthracene-5,8-dione nitrate which is converted to 4a-azoniaanthracene-5,8-dione perchlorate with aqueous sodium perchlorate.

4a-azoniaanthracene-5,8-dione perchlorate is reacted with 1,1-diethoxyethylene according to the procedure of Example 3 to obtain the adduct IV.

EXAMPLE 8

Preparation of IV, wherein $X^{\ominus}=ClO_4^{\ominus}$,

D=

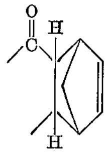

Z=V=H, Y=—CH=CH—, and Y and W taken together comprise the atoms required to complete a cyclopentene ring.

To 3.1 g. (0.01 mole) of 4a-azoniaanthracene-5,8-dione perchlorate suspended in 25 ml. of acetonitrile is added 1.4 g. (0.02 mole) of cyclopentadiene in 10 ml. of acetonitrile. After standing for 20 minutes at room temperature, the desired product (3.6 g.) is precipitated as yellow crystals by the addition of diethyl ether.

*Analysis.*—Calcd. for $C_{23}H_{20}ClNO_6$ (percent): C, 62.4; H, 4.5; Cl, 8.0; N, 3.2. Found (percent): C, 62.2; H, 4.4; Cl, 8.2; N, 3.5.

EXAMPLE 9

Preparaion of IV, wherein D is

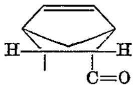

$X^{\ominus}=ClO_4^{\ominus}$, Z=V=H, Y=—CH=CH—, and Y and W taken together comprise the atoms required to complete a cyclopentene ring.

One part of 4a-azoniaanthracene-5,6-dione perchlorate is reacted with two parts of cyclopentadiene according to the procedure described in Example 4 to obtain the adduct IV.

*Analysis.*—Calcd. for $C_{23}H_{20}ClNO_6$ (percent): C, 62.4; H, 4.5; Cl, 8.0; N, 3.2. Found (percent): C, 62.7; H, 4.8; Cl, 8.6; N, 3.5.

EXAMPLE 10

Preparation of o-quinone adduct IV, wherein

D=

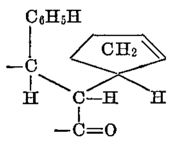

$X^{\ominus}=ClO_4^{\ominus}$, Z=V=H, and Y and W taken together comprise the atoms required to complete a cyclopentene ring.

One part of 8-phenyl-4a-azoniaanthracene-5,6-dione perchlorate is reacted with two parts of cyclopentadiene according to the procedure described in Example 4 to obtain the title compound.

It will be noted in Examples 8, 9 and 10 that cyclopentadiene reacts both as a diene and a dienophile, reacting as a diene with the cyclenone ring system in the well known manner and as a dienophile with the diene portion of the quinolizinium ring system in accordance with the teachings of our invention. The resultant adducts, therefore, each contain two cyclopentene ring systems.

EXAMPLE 11

A solution of 3 parts by weight of VIII and 97 parts by weight of dimethylformamide is coated on a grained aluminum plate and allowed to dry. The resulting photographic element is exposed through a positive transparency in a copier to a 1200 watt high pressure mercury lamp at a belt speed of 1½ feet per minute (corresponding to an exposure of about 1 minute), swabbed with methanol and rubbed with lithographic ink to obtain a replica of the image on the positive transparency.

EXAMPLE 12

A solution consisting of 3 parts by weight of XIV

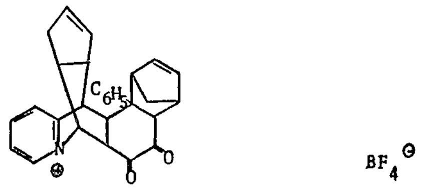

(XIV)

in 97 parts by weight of dimethyl sulfoxide is coated on a grained aluminum plate and allowed to dry. The resulting photographic element is exposed through a negative transparency in a copier at a belt speed of 1½ feet per minute, developed with 1:9 isopropanol-water, rubbed with lithographic ink, and treated with an acidic desensitizing etch to obtain a positive, inked image suitable for lithography.

EXAMPLE 13

A solution consisting of 3 parts by weight of XV

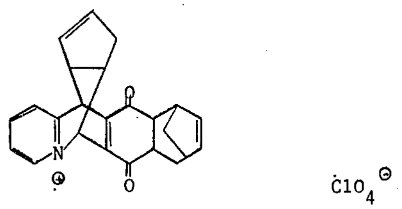

(XV)

in 97 parts by weight dimethyl sulfoxide is coated on a grained aluminum plate and allowed to dry. The resulting photographic element is exposed through a negative transparency in a copier at a belt speed of 1½ feet per minute, rubbed with lithographic ink and swabbed with an acidic desensitizing etch to obtain a positive, inked image.

In a preferred embodiment of our invention, a composition comprising an azonia diazo ketone corresponding to Formula IV, wherein $X^{\ominus}$, Z, Y, W and V have the same meaning as above, and D corresponds to the grouping

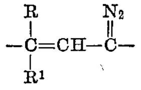

in which each of R and $R^1$ represents hydrogen, alkyl, aryl, halogen, aralkyl, alkoxy, etc., is coated upon a support as described hereinabove, exposed to a pattern of ultraviolet light and developed with an aqueous alkaline solution as described hereinabove to selectively remove the exposed materials and provide an image suitable for lithographic and resist purposes. Specific illustrations of this embodiment of our invention are given in the following examples.

EXAMPLE 14

Preparation of a positive working lithographic plate

A one percent solution of 6-diazo-5-oxo-8-phenyl-5,6,9,10-tetrahydro-4a-azonia - 9,10 -cyclopent - 14 - enoanthracinium tetrafluoroborate in cyclohexanone is coated on a grained aluminum plate, dried and exposed through a photographic line positive transparency to an ultraviolet light at a distance of 10 inches for five minutes. Development of the exposed plate in water followed by treatment with an acidic, gum-free etch, and inking with lithographic ink gives a positive lithographic image.

EXAMPLE 15

Preparation of a positive working photoresist layer

A solution of 0.3 g. of 6-diazo-5-oxo-8-phenyl-5,6,9,10-tetrahydro - 4a - azonia - 9,10-cyclopent-15-enoanthracinium tetrafluoroborate and 1.05 g. of a phenol-formaldehyde resin in a mixture of 10 ml. of cyclohexanone and 15 ml. of acetone is prepared, filtered, and the filtrate whirl-coated on a copper plate. The dried plate is heated at 80° for 5 minutes, exposed through a step tablet to a mercury vapor lamp for 6 minutes and tray developed for 2 minutes in an aqueous 8% trisodium phosphate-0.5% sodium hydroxide solution to obtain a reproduction of the step tablet through density 0.68.

EXAMPLE 16

Photographic elements are prepared from four different azonia salts (perchlorates and fluoroborates). These coatings are all made on grained aluminum from 3–4 percent solutions in appropriate organic solvents. The coated elements are then exposed through a positive transparency on a copier to a 1200-watt high-pressure mercury lamp at 1½ feet per minute (actual exposure, about one minute). The exposed coatings are observed for print-out or bleach-out images and are then given various development treatments to see if any lithographic images could be obtained. A print-out image indicates that the photoproduct is more colored than the starting material.

(A) 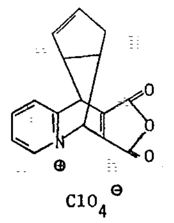

(B) 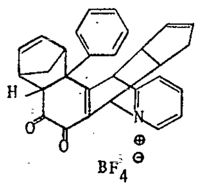

(C) 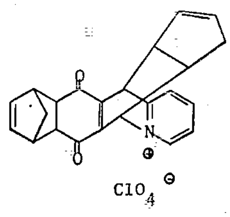

Coating A gives no visible image. If developed with methanol, or with dilute isopropanol and inked, it is positive working. It cannot be etched with an acid etch.

There is no visible image with B. If developed with dilute isopropanol, inked and then acid etched, it is negative working.

Coating C gives no visible image. If treated with a greasy litho ink and then swabbed gently with a desensitizing etch, a very faint negative working litho image results. Any use of alcohol or dilute alcohol removes the image.

EXAMPLE 17

Lithographic elements are prepared using polymeric binders and developing them in organic solvents as well as in dilute basic solutions.

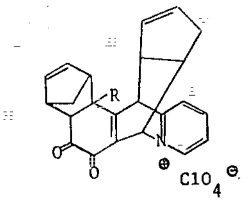

A,B

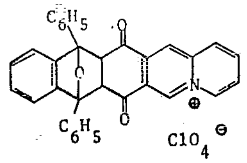

C (A) R = H (B) R = $C_6H_5$

Whirl-coatings are made on grained aluminum of four percent of each of the above salts and two percent of a novolak resin, in 4:1 dimethylformamide:2-ethoxyethanol. Coatings are also made with four percent of each salt and one percent cellulose acetate hydrogen phthalate in 4:1 dimethylformamide:cyclohexanone. After drying, the coatings are exposed through a negative transparency on a copying machine at a belt speed of 1½ feet per minute.

Salt A, when coated with either polymer and developed with either five percent aqueous trisodium phosphate or with 75 percent aqueous isopropanol followed by swabbing with an acidic desensitizing etch and a greasy ink, gives negative working lithographic plates, i.e., a positive ink receptive image from exposure through the photographic line and halftone negative.

Salt B gives similar results. The preferred development is with aqueous trisodium phosphate, followed by an acidic etch and inking.

Salt C gives a brownish print-out image which remains as the plates are developed in dilute aqueous trisodium phosphate and acid etched. The plate with salt C plus the novolak is negative working and that from salt C and the cellulose acetate hydrogen phthalate is positive working.

These salts also form useful lithographic elements when used with other polymeric binders and with polymer:salt ratios including at least up to 5:1.

Related applications in the name of Donald Lee Fields filed June 13, 1967, are Serial No. 645,639 entitled "4a-Azonianathracene Adduct and Derivatives Thereof," now Patent 3,439,306, Ser. No. 645,638 entitled "9-10 (o-Arylene)-9,10-Dihydro-4a-Azoniaanthracenes and Process Therefor," now Pat. 3,388,782 and Ser. No. 645,637 entitled "Synthesis of 2-Naphthol Anthracene and Derivatives Thereof."

The invention has been described in detail with particular reference to preferred embodiments thereof, but it will be understood that variations and modifications can be effected within the spirit and scope of the invention as described hereinabove and as defined in the appended claims.

What is claimed:

1. A photosensitive element comprising a support bearing a layer of a light-sensitive adduct having the formula:

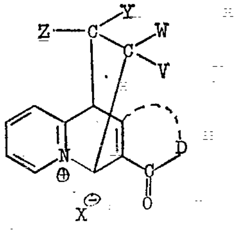

where X⊖ is an anion; D represents the atoms necessary to form a 5 or 6 membered ring, said atoms in D containing a $$-\overset{\overset{\displaystyle O}{\|}}{C}- \text{ or } -\overset{\overset{\displaystyle N_2}{\|}}{C}-$$

group, each of V, W, Y and Z separately being hydrogen, alkyl, aryl, cyano, alkylthio, alkoxy, diaalkylamino or aralkyl, provided no more than one of V, W, Y and Z is cyano; Y and Z when taken together being alkylenedioxy or V, W. Y and Z when taken together being the atoms or chemical bonds necessary to form a 5 or 6 membered fused ring.

2. The photosensitive element of claim 1 wherein the light-sensitive adduct is in a film-forming resin.

3. The photosensitive element of claim 2 wherein the film-forming resin is a phenol-aldehyde resin.

4. The photosensitive element of claim 1 wherein the support is an aluminum plate.

5. The photosensitive element of claim 1 wherein D represents the group $$-\underset{\underset{\displaystyle R_1}{|}}{\overset{\overset{\displaystyle R}{|}}{C}}=CH-\overset{\overset{\displaystyle N_2}{\|}}{C}-$$

where each of R and $R_1$ represents hydrogen, alkyl, aryl, halogen, alkoxy or aralkyl.

6. The photosensitive element of claim 1 wherein D represents the group

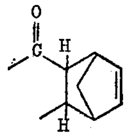

7. The photosensitive element of claim 1 wherein Z and V are hydrogen, Y represents a—CH=CH— group and W represents the atoms and bonds which together with Y are required to complete a cyclopentenyl ring.

8. A grained aluminum support bearing a layer of a light-sensitive adduct having the formula:

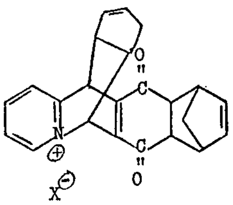

where X⊖ is an anion.

9. A grained aluminum support bearing a layer of a light-sensitive adduct having the formula:

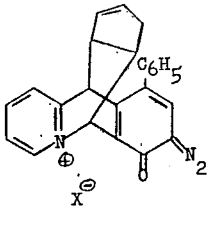

where X⊖ is an anion.

10. A photosensitive composition comprising a film-forming resin and a light-sensitive adduct having the formula:

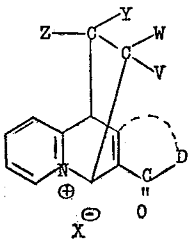

where X⊖ is an anion; D represents the atoms necessary to form a 5 or 6 membered ring, said atoms in D containing a $$-\overset{\overset{\displaystyle O}{\|}}{C}- \text{ or } -\overset{\overset{\displaystyle N_2}{\|}}{C}-$$

group, each of V, W, Y and Z separately being hydrogen, alkyl, aryl, cyano, alkylthio, alkoxy, dialkylamino or aralkyl, provided no more than one of V, W, Y and Z is cyano; Y and Z when taken together being alkylenedioxy or V, W, Y and Z when taken together being the atoms or chemical bonds necessary to form a 5 or 6 membered fused ring.

11. The photosensitive composition of claim 10 containing from 0.1 to 50 parts by weight of film-forming resin per part of adduct.

12. The photosensitive composition of claim 11 where D represents the group $$-\underset{\underset{\displaystyle R_1}{|}}{\overset{\overset{\displaystyle R}{|}}{C}}=CH-\overset{\overset{\displaystyle N_2}{|}}{C}-$$

where each of R and $R_1$ represents hydrogen, alkyl, aryl, halogen, alkoxy or aralkyl.

13. The photosensitive composition of claim 11 where D represents the group

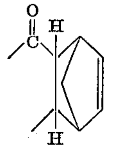

14. The photosensitive composition of claim 11 where Z and V are hydrogen, Y represents a —CH=CH— group and W represents the atoms and bonds which together with Y are required to complete a cyclopentenyl ring.

15. The photosensitive composition of claim 11 where the film-forming resin is a phenol-formaldehyde resin and comprises from 5 to 10 parts by weight per part of the light-sensitive adduct.

16. A photosensitive composition comprising a light-sensitive adduct and from 5 to 10 parts by weight per part of adduct of an alkali-soluble phenol-formaldehyde resin, the adduct having the formula:

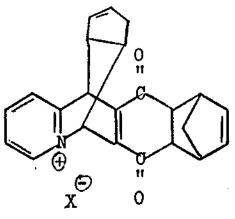

where X⊖ is an anion.

17. A photosensitive composition comprising a light-sensitive adduct and from 5 to 10 parts by weight per part of adduct of an alkali-soluble phenol-formaldehyde resin, the adduct having the formula:
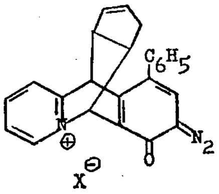
where $X^{\ominus}$ is an anion.
References Cited
FOREIGN PATENTS
417,601 7/1966 Switzerland.
NORMAN G. TORCHIN, Primary Examiner
J. D. WINKELMAN, Assistant Examiner
U.S. Cl. X.R.
96—33, 67, 88

PO-1050
(5/69)

UNITED STATES PATENT OFFICE
CERTIFICATE OF CORRECTION

Patent No. 3,567,451 Dated March 2, 1971

Inventor(s) Douglas G. Borden, Donald L. Fields, and Jerry B. M:

It is certified that error appears in the above-identified patent and that said Letters Patent are hereby corrected as shown below:

R N2
' '
Column 14, line 35, "-C=CH-C-" should read -- -C=CH-C- --
'
R1

(in the corrected formula, R above -C= with a single bond, $N_2$ above the last C with a double bond ", $R_1$ below)

Signed and sealed this 22nd day of June 1971.

(SEAL)
Attest:

EDWARD M.FLETCHER,JR.
Attesting Officer

WILLIAM E. SCHUYLER, JR.
Commissioner of Patents